(12) United States Patent
Nash

(10) Patent No.: US 6,317,589 B1
(45) Date of Patent: *Nov. 13, 2001

(54) RADIO RECEIVER AND METHOD OF OPERATION

(75) Inventor: Adrian Philip Nash, Surrey (GB)

(73) Assignee: Nokia Mobile Phones Limited, Espoo (FI)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/086,071

(22) Filed: May 28, 1998

(30) Foreign Application Priority Data

Jun. 6, 1997 (GB) .................................. 9711823

(51) Int. Cl.[7] ..................................... H04B 1/06
(52) U.S. Cl. .................. 455/245.2; 455/226.2; 455/240.1; 455/67.1; 375/345
(58) Field of Search ................. 455/323, 226.2, 455/230, 232.1–245.2, 252, 373, 324; 375/329, 330, 346, 347; 330/278–285

(56) References Cited

U.S. PATENT DOCUMENTS

| | | | |
|---|---|---|---|
| 4,584,710 | | 4/1986 | Hansen ............................ 455/226 |
| 4,856,027 | * | 8/1989 | Nakamura et al. ................. 375/327 |
| 4,922,549 | * | 5/1990 | Johnson et al. ................... 455/212 |
| 4,955,078 | * | 9/1990 | Chung ............................. 455/244.1 |
| 5,052,050 | * | 9/1991 | Collier et al. .................... 455/296 |
| 5,481,226 | * | 1/1996 | Parkes, Jr. ....................... 330/279 |
| 5,604,929 | * | 2/1997 | Loper et al. ...................... 455/324 |
| 5,696,819 | * | 12/1997 | Suizu et al. ...................... 379/390 |
| 5,848,104 | * | 12/1998 | Ishizu ............................. 375/324 |
| 5,854,973 | * | 12/1998 | Holtvoeth ........................ 455/245.1 |
| 5,926,749 | * | 7/1999 | Igarashi et al. ................... 455/127 |

FOREIGN PATENT DOCUMENTS 0305 603 A1   3/1989 (EP) .
411017748A  * 1/1999 (JP) .

OTHER PUBLICATIONS

"Yu Hewhu Cordic–Base VLSI Architectures for Digital Signal Processing" IEEE Signal Processing Magazine, pp. 16 to 35, Jul. 1992.
United Kingdom Search Report.

* cited by examiner

Primary Examiner—Nay Maung
Assistant Examiner—Charles Carver
(74) Attorney, Agent, or Firm—Perman & Green, LLP

(57) ABSTRACT

A gain compensation loop suitable for a quadrature receiver comprises a signal strength comparator having in-phase and quadrature signals fed to respective inputs of the signal strength comparator. The signal strength comparator outputs a signal which represents the difference in strength between the in-phase and quadrature signals. The signal output from the signal strength comparator is input to a gain adjuster which adjusts the gain of the in-phase or quadrature signal in accordance with the signal from the signal strength comparator to bring the in-phase and quadrature signals towards the same strength.

14 Claims, 3 Drawing Sheets

RADIO RECEIVER AND METHOD OF OPERATION

BACKGROUND OF THE INVENTION

The present invention relates to a radio receiver, in particular but not exclusively, to a gain compensation loop for a quadrature receiver.

The current trend in receiver technology is to reduce weight, volume, power consumption and cost. This is particularly important for receivers in portable apparatus such as radio telephones. This has resulted in receiver architecture designs in which there are no or few discrete radio frequency (RF) and intermediate frequency (IF) filters in the receiver front end.

An example of a receiver architecture having few discrete RF and IF filters is a single conversion low-IF architecture for a quadrature receiver. Single conversion low-IF architectures typically produce an image signal which is very close to the wanted signal. Such image signals are termed "in-band" image signals, and may be filtered out using a single sideband filter. However, a portion of the image signal appears at the wanted signal frequency as cross-talk if there is an imbalance between the phase and/or gain of respective quadrature signals. It is desirable for such cross-talk to be reduced or rejected. Typically, a quadrature receiver front end can only achieve about 30dB of image-to-signal cross-talk rejection, which is often insufficient for many applications such as radio telephones.

A solution to the problem of cross-talk is to use a double-quadrature mixer architecture. However, such an architecture requires 90° phase shifts on both the local oscillator and RF ports coupled to four mixers. Providing at least one of the ports (e.g. the local oscillator) is phase and amplitude balanced, any imbalance at the other port (e.g. the RF port) results in a spurious product at a frequency given by the sum of the RF and local oscillator frequencies. This can be easily filtered out using an RF bandpass filter before the mixers.

A drawback of the above approach is that four mixers are required resulting in relatively high power consumption. Additionally, a relatively bulky RF 90° hybrid coupler is also required together with quadrature balance on the local oscillator port.

SUMMARY OF THE INVENTION

According to a first aspect of the invention there is provided a gain compensation loop for a quadrature receiver adapted to generate first and second quadrature signals from a received signal, the gain compensation loop comprising: a signal strength comparator for receiving the first and second signals and adapted to output a third signal indicative of a difference in signal strength between the first and second signals; and gain adjusting means for adjusting the strength of the first signal in accordance with the third signal thereby bringing the first and second signals towards the same strength.

According to a second aspect of the invention there is provided a method for gain compensation in a quadrature receiver adapted to generate first and second quadrature signals from a received signal, the method comprising the steps of: comparing the signal strength of the first signal with the signal strength of the second signal; deriving a third signal indicative of a difference in strength between the first and second signals; and adjusting the strength of the first signal in accordance with the third signal.

Preferred embodiments in accordance with first and second aspects of the invention have the advantage that the strength of the first and second signals may be brought towards a balance by appropriate control of the gain adjusting means. Thereby image cross-talk may be reduced. This obviates the need for image rejection filters in the RF front end of the receiver which results in lower weight, volume, loss and cost for such receivers.

In a preferred embodiment the gain adjusting means is disposed in the radio frequency front end of a quadrature receiver which has the advantage that any image rejecting filters in the intermediate frequency region of the receiver are less likely to be overdriven by a strong image signal.

Preferably, the gain adjusting means comprises variable gain mixer, which is suitably one of the mixers in the quadrature receiver.

Optionally, the gain adjusting means is disposed after the radio frequency front end and is operable for signals at an intermediate frequency of a quadrature receiver. Such an intermediate frequency may be zero Hertz (0 Hz) for a gain compensation loop in a direct conversion receiver, for example.

Suitably, the gain adjusting means and/or gain comparator comprise an appropriately conditioned digital signal processor, which advantageously is environmentally independent and does not require external components. Alternatively, the gain adjusting means comprises an amplifier.

The gain compensation loop may comprise a loop filter having an input for receiving the third signal and an output for providing a control signal to the gain adjusting means, thereby providing for tracking a dynamic gain or signal strength imbalance between first and second signals.

BRIEF DESCRIPTION OF THE DRAWINGS

Embodiments in accordance with the invention will now be described, by way of example only, and with reference to the accompanying drawings, in which.

DETAILED DESCRIPTION OF THE INVENTION

Figure 1:
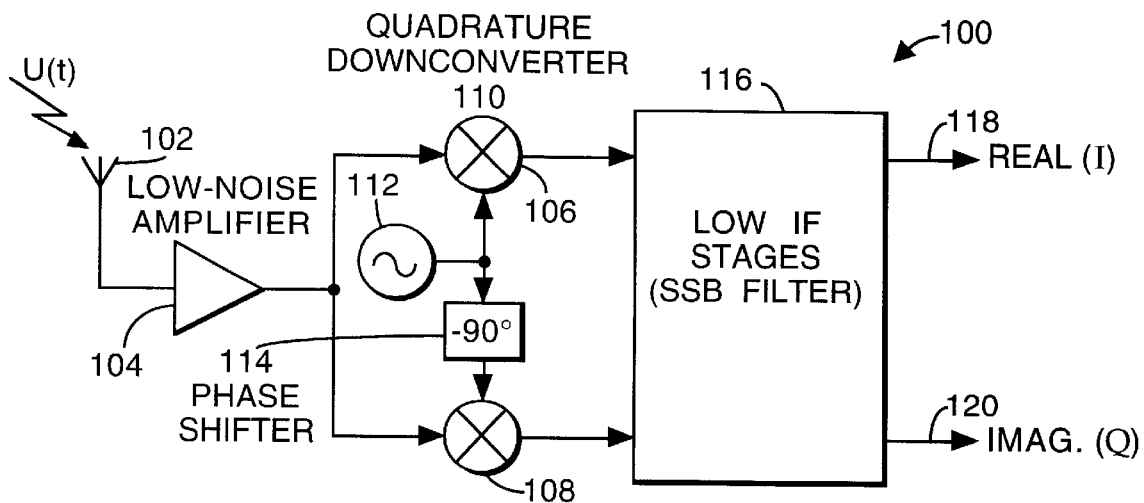
FIG. 1 is a schematic diagram of a quadrature single-conversion RF front end.

FIG. 1 shows a schematic diagram for a quadrature single-conversion receiver RF front end 100. A radio frequency signal v(t), such as an AM or FM modulated signal, is received by antenna 102. The received signal v(t) is amplified by low-noise amplifier 104 and the amplified signal is input to mixers 106 and 108 by a power splitter. The mixers 106 and 108 form part of quadrature down-converter 110. The signal LO output from local oscillator 112 has a frequency which is very close to the carrier frequency, fc, of the received signal v(t). The LO signal is fed directly into mixer 106 and is fed into mixer 108 via a −90° phase shifter 114. Optionally, mixers 106 and 108 could each be fed via phase shifters.

Figure 2:
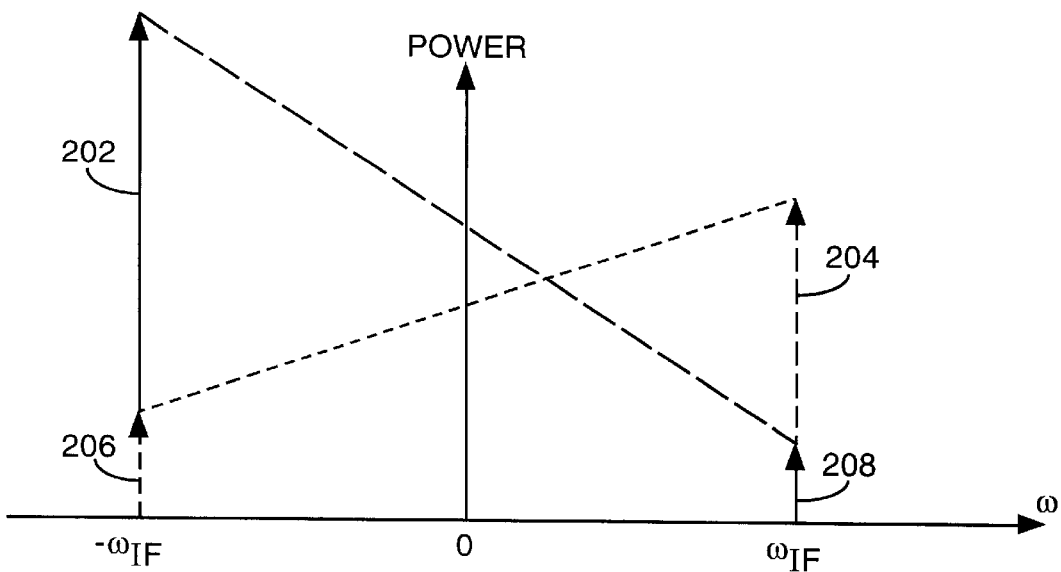
FIG. 2 shows a schematic representation of wanted and image signals, and image crosstalk.

Respective signals output from mixers 106 and 108 have a center frequency at an intermediate frequency, $I_F$. For a single conversion receiver suitable for a radio telephone the IF may be as low as half of the signal bandwidth which is close to the baseband frequency of a typical radio telephone. This would be 20kHz for a radio telephone operating in an analogue radio telephone system such as Total Access Communication System (TACS), or 100kHz for the Global System for Mobiles (GSM) radio telephone system. The IF signal from mixer 106 is referred to as the "Real" or "in-phase" (I) signal, and the IF signal from mixer 108 is termed the "Imaginary" or "Quadrature" (Q) signal. Both the I and Q IF signals, hereinafter referred to as I and Q signals, comprise a wanted signal and image signal as shown in FIG. 2 using the I signal as an example. The origin of image signal 202 and wanted signal 204 is well known to persons of ordinary skill in the art, and will not be discussed further.

FIG. 2 shows responses at the wanted frequency $\omega_{IF}$, and an unwanted image response at $-\omega_{IF}$. The response at $\omega_{IF}$ comprises the wanted signal 204 and an unwanted interfering signal 208. Unwanted signal 208 is a fraction of an image signal 202 occurring at a frequency $-\omega_{IF}$ and is known as an image cross-talk signal. Signal 206 is a fraction of the wanted signal 204, and interferes with image signal 202.

Cross-talk signals may arise due to phase and/or gain imbalance between mixers 106 and 108. In practical systems this is a serious drawback since pairs of mixers which are sufficiently well-balanced to reduce cross-talk to −60 dB for example, as required by operating standards for cellular telephones, are commercially unavailable. Other sources of phase/gain imbalance may be temperature variations or varying input loads on the mixers for example.

Figure 3:
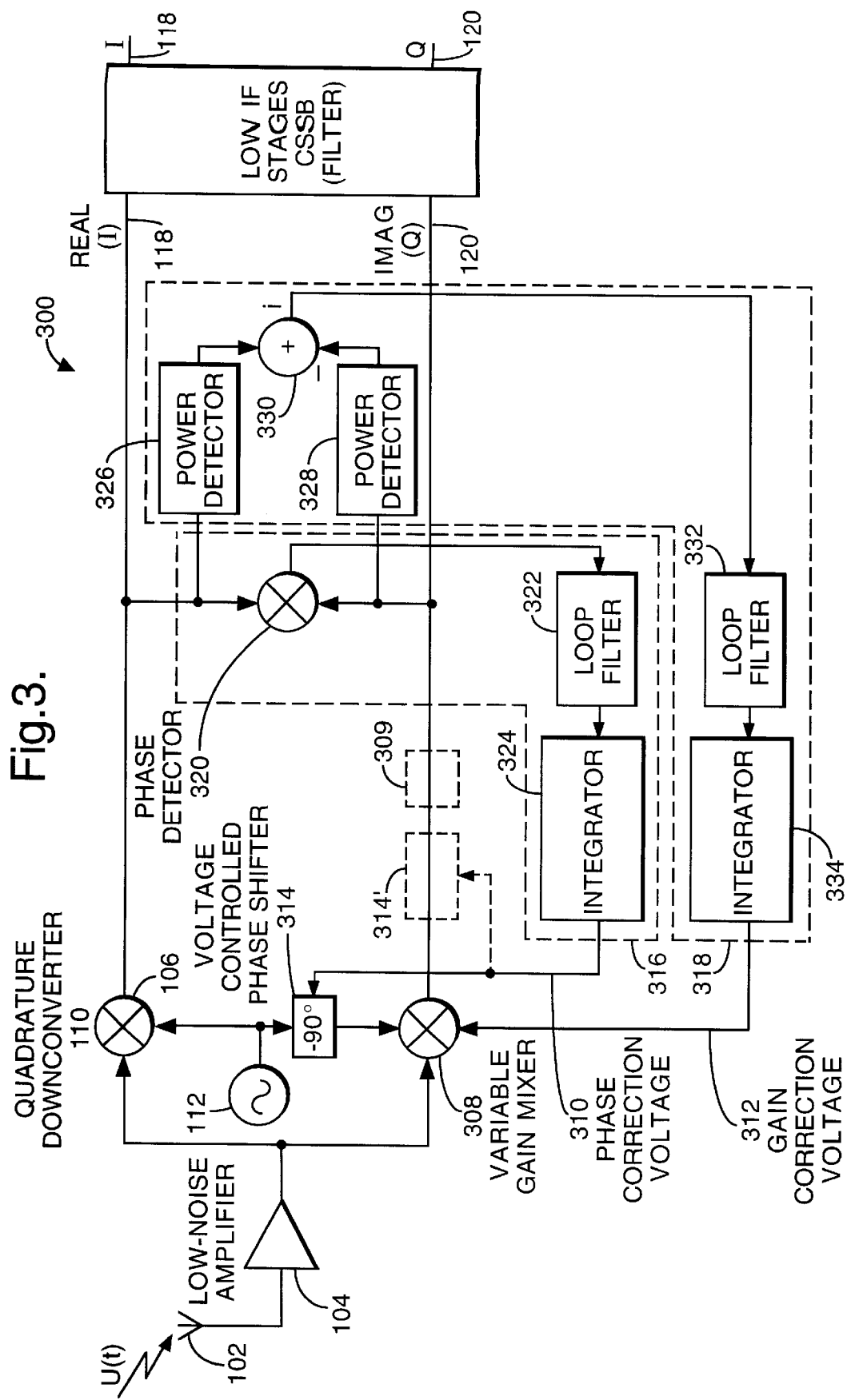
FIG. 3 is a schematic diagram of a quadrature receiver in accordance with an embodiment of the present invention.

A first embodiment of a quadrature single-conversion receiver 300 in accordance with the present invention is shown in FIG. 3. Like elements to those shown in FIG. 2 are referred to with like reference numerals.

Radio frequency signal v(t) is received by antenna 102 and amplified by low-noise amplifier 104. The amplified output from low-noise amplifier 104 is then input to quadrature down converter 110, which provides means for generating quadrature signals from received signal v(t). The low-noise amplifier 104 and quadrature down converter 110 form a RF front end for receiver 300, which converts the received RF signal v(t) down to a frequency $+\omega_{IF}$ and an image signal to a frequency $-\omega_{IF}$, for the RF signal v(t) having a greater frequency than a local oscillator signal (LO) and the image signal having a lower frequency than the local oscillator signal (LO). Quadrature down converter 110 comprises mixers 106 and 308. Mixer 106 is driven directly by the output (LO) of local oscillator 112. Mixer 308 is a variable gain mixer, and is driven by the output (LO) of local oscillator 112 having passed via phase shifting means such as voltage controlled phase shifter 314. The voltage controlled phase shifter 314 provides a nominal phase shift of −90°. Voltage controlled phase shifter 314 is controlled by phase correction voltage 310 originating from phase correction loop 316, and the variable gain mixer 308 is controlled by the gain correction voltage 312 derived from the gain correction loop 318. Alternatively, a voltage controlled phase shifter 314' may be provided to act on the Q signal output from mixer 308, and phase shifter 314 may be static at a nominal −90°. The low IF stage also comprises a Single Side Band (SSB) filter 116 which passes the wanted signal at $+\omega_{IF}$ and attenuates the image signal at $-\omega_{IF}$. The real and imaginary outputs 118/120 respectively are provided to a complex domain demodulator for example a FM detector or a digital detector suitable for digital systems. Optionally, mixer 308 may be a static gain mixer, and an extra gain element 309 may be provided on the output of mixer 308.

Phase correction is performed using phase correction loop 316 which is a modified form of a phased lock loop (PLL). Phase detector 320 has the I and Q signals respectively generated by mixers 106 and 308 input to it and generates an output which is proportional to a deviation from 90° in the phase difference between the I and Q signals. If the difference between the I and Q signals is exactly 90°, then the output of phase detector 320 is zero. The output of phase detector 320 is input to an optional phase loop filter 322. Phase loop filter 322 is not required if the phase imbalance does not change, or varying imbalance phase does not need to be tracked. The output from phase loop filter 322 is forwarded to integrator 324. Integrator 324 integrates the phase detector output and generates a phase correction voltage which may be applied to phase shifter 314. The phase correction loop adjusts the voltage control to phase shifter 314 until the phase difference between the I and Q signals is exactly 90°. Phase shifter 314 may comprise any suitable phase shifting means such as a transistor or varactor diode, whereby phase control may be achieved by varying the current flowing through the transistor or voltage across varactor diode. If there are any DC offsets in any of the components comprising the phase correction loop then these will either have to be calibrated out on initialising the system, or taken into account when controlling the voltage controlled phase shifter 314.

Gain correction is performed by gain correction loop 318, which comprises power detectors 326 and 328 respectively. Signals I and Q are input respectively to power detectors 326 and 328. The outputs from respective power detectors 326/328 are input into subtractor 330. The output from subtractor 330 is input to optional gain loop filter 332. Gain loop filter 332 is not required if the gain imbalance does not change, or varying gain imbalance does not need to be tracked.

The power detectors 326 and 328 generate outputs proportional to the I and Q signal powers respectively. When the gain in each path is the same, the output from subtractor, typically a differential amplifier, is zero.

The output from gain loop filter 332 is fed into integrator 334 which outputs a gain correction voltage 312 to variable gain mixer 308. Utilising the above described gain correction loop, gain imbalance between the I and Q signals may be reduced.

A quadrature single-conversion receiver in accordance with the circuit shown schematically in FIG. 3 is capable of providing I and Q signals comprising low levels of cross-talk. A more detailed description of the operation of the phase correction loop will now be described, with reference to FIG. 4.

Figure 4A:
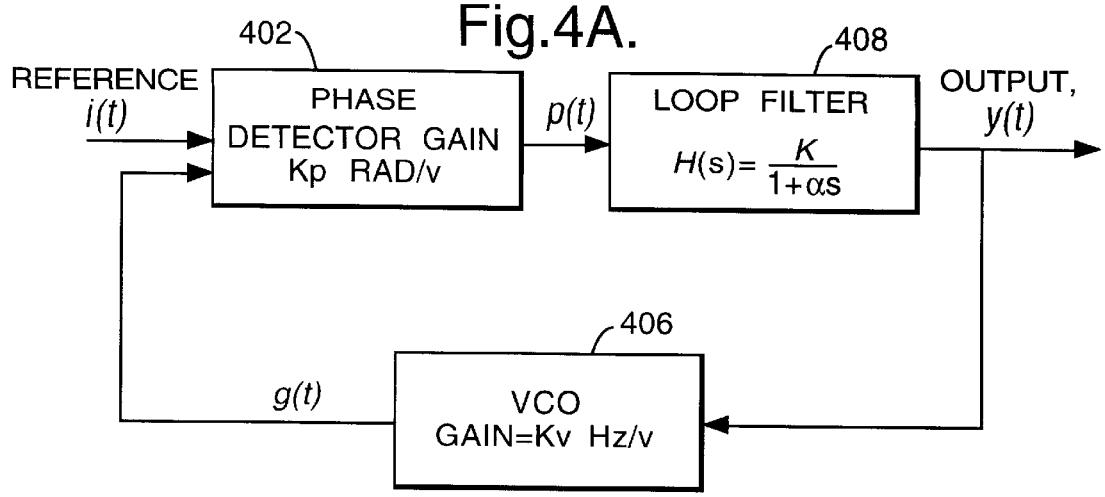
FIG. 4A is a schematic diagram of a conventional phase locked loop.

FIG. 4A shows a typical phase locked loop (PLL). Phase detector 402 has an output p(t) which is proportional to the difference in phase between reference signal i(t) and the Voltage Controlled Oscillator (VCO) 406 output signal q(t). The output signal p(t) for phase detector 402 is input to a loop filter 408. Loop filter 408 has a transfer function given by H(s). The output y(t) from loop filter 408 is fed into the input of VCO 406. Phase detector 402 has a gain of Kp in units of volts per radian, and VCO 406 has a gain of Kv in units of radians per second per volt. For a digital phase comparator, for example an XOR gate, and where i(t), q(t) are digital wave forms, the phase detector characteristic is linear. When an analogue multiplier type of phase detector is used the output p(t) is proportional to sin (θ), where θ is the phase difference between the input signals. The output of phase detector 402 is zero when the phase difference between the inputs is 90° or −90°. A PLL of this type therefore locks its VCO to the same frequency as, but 90° out of phase with, the reference frequency.

The phase correction loop in accordance with the embodiment shown in FIG. 3 acts to provide a 90° phase difference between the I and Q signal in the quadrature single-conversion receiver. By replacing the VCO shown in FIG. 4A above with an imaginary signal Q, and the reference signal i(t) by the real signal I it is possible to provide a 90° phase difference between the I and Q signals. Effectively, the VCO is replaced by the Q signals front end mixer 308, phase shifter 314 and all its IF processing circuitry from FIG. 3. The Q signal is now phase controlled, and can be varied independently of the local oscillator drive in order to achieve an appropriate phase balance. A schematic diagram of such a system suitable for the alternative embodiment of receiver 300 described above is described below with reference to FIG. 4B.

Figure 4B:
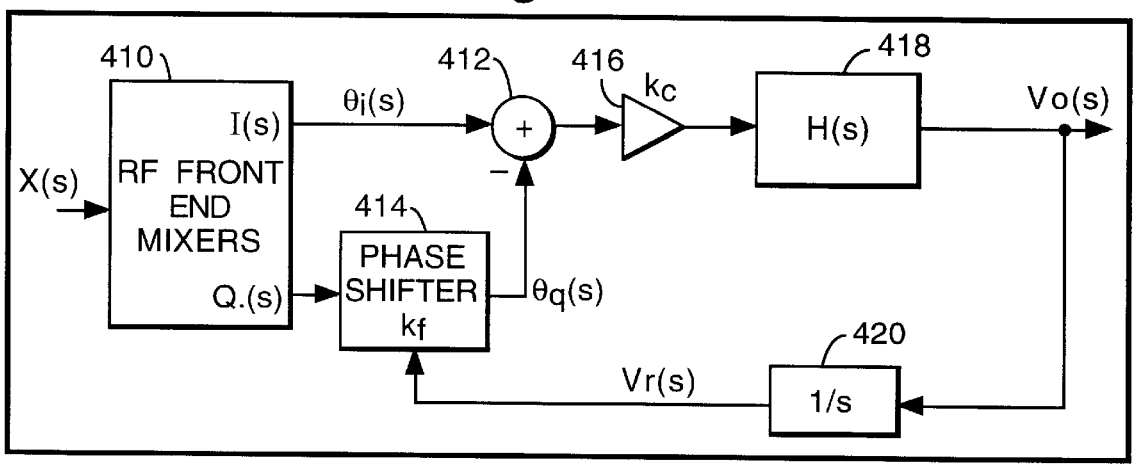
FIG. 4B is a schematic diagram of a phase compensation loop in accordance with an embodiment of the present invention.

The phase correction loop schematically shown in FIG. 4B, is described in the frequency (s) domain. A signal X(s) is input to RF front end mixers 410. The I channel output θ$_i$(s) is input to a phase comparator 412. The quadrature output is fed into phase shifter 414 and the resulting quadrature signal θ$_q$(S) is fed into the negative input of comparator 412. For simplicity, an ideal phase comparator function θ$_{ew}$=θ$_i$(S)−θ$_q$(S) is assumed, where θ$_{ew}$ is the phase difference. A skilled person would readily appreciate that any offsets or non-linearities in phase comparator 412 would have to be accounted for during calibration of the comparator. The output of comparator 412 goes to gain element 416 which has a gain of Kc. (Gain element 416 represents the gain associated with the phase detector. The output from gain element 416 is input to a loop filter 418 having a transfer function H(s). The output from the loop filter 418 is input to an integrator 420 having a transfer function 1/s. The output from the integrator V$_f$(s) is input to phase shifter 414. Phase shifter 414 has a gain K$_f$ with dimensions of radians per volt. The output of the loop is given as V$_0$(s).

The phase correction loop transfer function is given by;

$$\frac{V_0(s)}{\theta_i(s)} = \frac{k_c s H(s)}{s + k_c k_f H(s)} \quad (4)$$

For a first order PLL in which H(s)=1;

$$\frac{V_0(s)}{\theta_i(s)} = \frac{k_c s}{s + k_c k_f} \quad (5)$$

The response to a unit impulse in phase is given by θ$_i$(s)=1, such that $$V_0(s) = \frac{k_c s}{s + k_c k_f}, \text{ and} \quad (6)$$

The response to a step change in phase is given by θ$_i$(s)=1/s. such that $$V_0(s) = \frac{k_c}{s + k_c k_f}. \quad (7)$$

The inverse Laplace transform produces, $$v_0(t) = k_c e^{k c k_f t} \quad (8)$$

for the time domain.

Equation (8) describes the transient response of the loop to a step change in θ$_i$ channel phase error. For t tending to infinity;

$$v_0(\infty) = k_c e^{-\infty} = 0. \quad (9)$$

The phase error ϵ(s) is proportional to V$_0$(s) when H(s)=1;

$$\varepsilon(s) = \frac{V_0(s)}{k_c H(s)} \xrightarrow{H(s)=1} \frac{V_0(s)}{k_c}, \quad (10)$$

and in time, the final phase error $$\epsilon(\infty) = 0. \quad (11)$$

Thus, a modified first order phase locked loop can be used for I/Q phase balance correction. However, a second order loop is required in order to track a changing phase imbalance (H(s)≠1). Such a second order loop will be readily implementable by a skilled person.

The loop gain k$_f$k$_c$ determines the dynamic properties of the loop. Reducing the gain narrows the bandwidth, raising the gain increases the bandwidth. The problem with too large a bandwidth is that phase noise (i.e. the quadrature component of the system noise) will start to take an effect on the loop. In many applications the time taken for the receiver to settle is important. If the loop bandwidth is too narrow, the image rejection will not settle quickly enough. Providing the integrator holds its voltage, the image rejection will be maintained between typical Time Domain Multiplex (TDM) receive bursts for example in a radio telephone system.

The operation of the optional embodiment of gain compensation loop 318 comprising a gain element 309 provided at the output of mixer 308 shown dotted in FIG. 3 will now be described with reference to FIG. 5.

Figure 5:
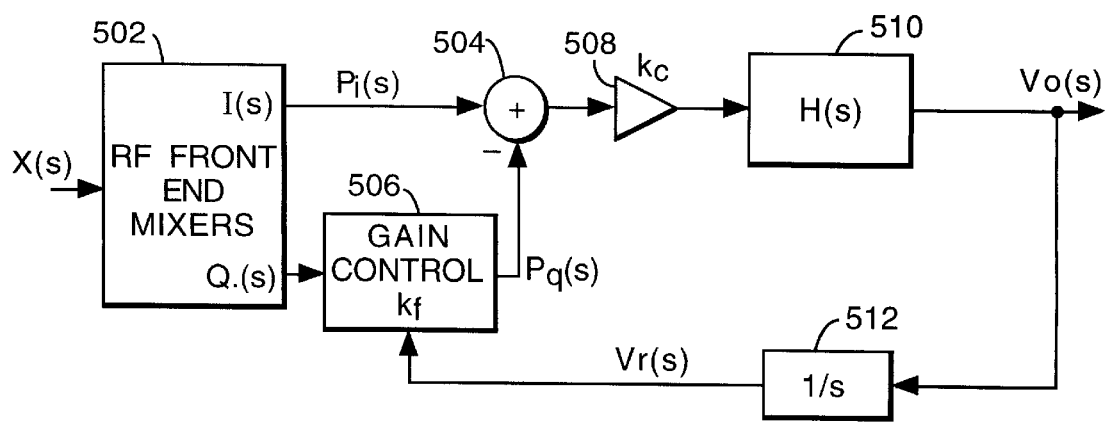
FIG. 5 is a schematic diagram of a gain compensation loop.

The gain loop shown in FIG. 5 may be utilised to correct or reduce gain imbalance in the front end mixers of a quadrature receiver such as shown in FIG. 3. The gain compensation loop is similar in operation to the phase compensation loop described above except that the phase shifter is replaced with a gain controller and power is measured instead of phase. The power measurement is made by squaring or rectifying, and smoothing the outputs from the I and Q channels.

Mathematically, the operation of the gain compensation loop may be described using equations (4) through to (11) with signal power P$_i$ and P$_q$ substituted for signal phase θ$_i$, θ$_q$.

The gain compensation loop shown schematically in FIG. 5 will now be described with reference to the frequency domain. The I channel output P$_i$(s) is input to a gain comparator 504. The Q channel output P$_q$(S) is input to a gain control element 506, and the output from the gain control element 506, is fed into the negative input of gain comparator 504. The output of gain comparator 504 is fed to gain element 508 having a gain k$_c$' and which represents the gain associated with the gain comparator 504. It will be evident to a skilled person that gain element 508 need not exist in practice.

The output of gain element 508 is input to gain loop filter 510 which has a transfer function H(s) and provides an output signal Vo(s). Signal Vo(s) is integrated by integrator 512 having a transfer function 1/s, and provides output signal Vf(s) to gain controller 506. Gain controller 506 has a gain $k_f$ with dimensions of decibels per volt. Optionally, the gain control could be dimension less and be the ratio of output to input voltage.

The gain correction loop transfer function is given by $$\frac{V_0(s)}{P_i(s)} = \frac{k_c s H(s)}{s + k_c k_f H(s)} \quad (12)$$

For a first order gain correction loop in which H(s)=1:

$$\frac{V_0(s)}{P_i(s)} = \frac{k_c s}{s + k_c k_f} \quad (13)$$

The response to a unit impulse in gain is given by $P_i(s)=1$ yielding $$V_0(s) = \frac{k_c s}{s + k_c k_f}, \text{ and} \quad (14)$$

the response to a step change in gain is given by $P_i(s)=I/s$, yielding $$V_0(s) = \frac{k_c}{s + k_c k_f} \quad (15)$$

Taking the inverse Laplace transform of (15) yields $$V_0(t) = k_c e^{k_c k_f t} \quad (16)$$

for the time domain, and describes the transient response of the gain compensation loop to a step change in I channel gain error.

Fort tending to infinity $$V_0(\infty) = k_c e^{-\infty} = 0 \quad (17)$$

The gain error E(s) is proportional to $V_0(s)$ when H(s)=1, yielding $$E(s) = \frac{V_0(s)}{k_c H(s)} \xrightarrow{H(s)=1} \frac{V_0(s)}{k_c} \quad (18)$$

and in time the final gain error $$E(\infty) = 0.$$

Thus, a first order gain locked loop can be used for I/Q gain balance correction in a similar manner to phase locked loop described above. Similarly, a second order loop is necessary to track a dynamic gain imbalance.

In similar fashion as for the phase compensation loop described above, the loop gain $k_c k_f$ determines the dynamic properties of the gain compensation loop. Reducing the gain narrows the bandwidth, raising the gain increases the bandwidth.

The embodiments of the phase compensation loop and gain compensation loop respectively described with reference to FIGS. 4B and 5, show the phase shifter 414 and gain controller 506 located after the RF front end mixers. Optionally, the phase shifter and gain controller may be incorporated in the RF front end as phase shifter 314 and variable gain mixer 30 thereby forming part of quadrature down converter 110 shown in FIG. 3.

The phase detector/comparator 320, 412 and power detector/comparator 326, 504 may be implemented digitally using digital signal processing (DSP) techniques based on the same mathematical principles described above. For example, a controllable phase shifter may be implemented by a Hilbert Rotator or by utilising the well-known CORDIC algorithm ("YU HEWHU CORDIC-Base VLSI Architectures for Digital Signal Processing" IEEE Signal Processing Magazine, July 1992). In view of the foregoing description it will be evident to a person skilled in the art that various modifications may be made within the scope of the invention.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims may be formulated to such features during prosecution of this application or of any such further application derived therefrom.

What is claimed is:

1. A gain compensation loop for a quadrature receiver adapted to generate first and second quadrature signals from a received signal, the gain compensation loop comprising:
   a signal strength comparator for receiving the first and second signals and adapted to output a third signal indicative of a difference in signal strength between the first and second signals; and
   gain adjusting means for adjusting the relative strength of the first signal compared to the second signal in accordance with the third signal, thereby bringing the first and second signals towards the same strength.

2. A gain compensation loop according to claim 1, wherein the strength adjusting means comprises a variable gain mixer.

3. A gain compensation loop according to claim 1, wherein the gain adjusting means is operable for signals at an intermediate frequency of a quadrature receiver.

4. A gain compensation loop according to claim 3, wherein the gain adjusting means and/or gain comparator comprise a suitably conditioned digital signal processor.

5. A gain compensation loop according to claim 1, further comprising a loop filter having an input for receiving the first signal and output for providing a control signal to the gain adjusting means.

6. A quadrature receiver, comprising a gain compensation loop according to claim 1.

7. A quadrature receiver according to claim 6, wherein the gain adjusting means is disposed in the radio frequency front end of the quadrature receiver.

8. A method for gain compensation in a quadrature receiver adapted to generate first and second quadrature signals from a received signal, the method comprising the steps of:
   comparing the signal strength of the first signal with the signal strength of the second signal;
   deriving a third signal indicative of a difference in strength between the first and second signals; and
   adjusting the relative strength of the first signal compared to the second signal in accordance with the third signal.

9. A gain compensation loop for a quadrature receiver adapted to generate I and Q quadrature signals from a received signal, the gain compensation loop comprising:

a signal strength comparator for receiving the I and Q signals and adapted to output a third signal indicative of a difference in signal strength between the I and Q signals; and gain adjusting means for adjusting the relative strength of: one signal selected from a group consisting of: the I signal and the Q signal, in accordance with the third signal, thereby bringing the I and Q signals towards the same strength.

10. A method for gain compensation in a quadrature receiver adapted to generate I and Q quadrature signals from a received signal, the method comprising the steps of:

comparing the signal strength of the I signal with the signal strength of the Q signal;

deriving a third signal indicative of a difference in strength between the I and Q signals; and adjusting the relative strength of one signal selected from a group consisting of the I signal and the Q signal, in accordance with the third signal.

11. A communications device comprising:

a radio telephone, the radio telephone comprising:

a gain compensation loop for a quadrature receiver adapted to generate first and second quadrature signals from a received signal, the gain compensation loop comprising:

a signal strength comparator for receiving the first and second signals and adapted to output a third signal indicative of a difference in signal strength between the first and second signals; and gain adjusting means for adjusting the relative strength of the first signal compared to the second signal in accordance with the third signal, thereby bringing the first and second signals towards the same strength.

12. A method for gain compensation in a communications device, the method comprising the steps of:

adapting a quadrature receiver to generate first and second quadrature signals from a received signal, the quadrature receiver being located in a radio telephone device, adapting the quadrature receiver to generate first and second quadrature signals further comprises the steps of:

comparing the signal strength of the first signal with the signal strength of the second signal;

deriving a third signal indicative of a difference in strength between the first and second signals; and adjusting the relative strength of the first signal compared to the second signal in accordance with the third signal.

13. A communications device comprising:

a radio telephone device, the radio telephone device comprising:

a gain compensation loop for a quadrature receiver adapted to generate I and Q quadrature signals from a received signal, the gain compensation loop comprising:

a signal strength comparator for receiving the I and Q signals and adapted to output a third signal indicative of a difference in signal strength between the I and Q signals; and gain adjusting means for adjusting the relative strength of:

one signal selected from a group consisting of: the I signal and the Q signal, in accordance with the third signal, thereby bringing the I and Q signals towards the same strength.

14. A method for gain compensation in a communications device, the method comprising the steps of:

generating I and Q quadrature signals from a signal, wherein the signal is received by a radio telephone device;

comparing the signal strength of the I signal with the signal strength of the Q signal;

deriving a third signal indicative of a difference in strength between the I and Q signals; and adjusting the relative strength of one signal selected from a group consisting of the I signal and the Q signal, in accordance with the third signal.

* * * * *